United States Patent
Wang

(10) Patent No.: US 7,292,459 B2
(45) Date of Patent: Nov. 6, 2007

(54) SHIELDING CASE STRUCTURE OF HANDHELD COMMUNICATION APPARATUS

(75) Inventor: Szu Wei Wang, Taipei (TW)

(73) Assignee: Arima Communications Corp., Jhonghe, Taipei County (TW)

( * ) Notice: Subject to any disclaimer, the term of this patent is extended or adjusted under 35 U.S.C. 154(b) by 0 days.

(21) Appl. No.: 11/443,078

(22) Filed: May 31, 2006

(65) Prior Publication Data
US 2007/0217176 A1 Sep. 20, 2007

(30) Foreign Application Priority Data
Mar. 14, 2006 (TW) .............................. 95108638 A

(51) Int. Cl.
*H05K 9/00* (2006.01)
(52) U.S. Cl. ...................... 361/818; 361/753; 361/760; 361/800; 361/816; 174/352; 174/356; 174/377; 174/382; 174/387
(58) Field of Classification Search ................ 361/753, 361/760, 799, 800, 816, 818, 790; 174/352, 174/356, 377, 382, 387
See application file for complete search history.

(56) References Cited

U.S. PATENT DOCUMENTS

| | | | | | |
|---|---|---|---|---|---|
| 4,736,277 | A | * | 4/1988 | Brown ........................ | 361/816 |
| 5,455,746 | A | * | 10/1995 | Sato et al. ................... | 361/816 |
| 5,477,421 | A | * | 12/1995 | Bethurum .................... | 361/818 |
| 5,659,459 | A | * | 8/1997 | Wakabayashi et al. ...... | 361/753 |
| 5,742,488 | A | * | 4/1998 | Lonka et al. ................ | 361/816 |
| 6,335,869 | B1 | * | 1/2002 | Branch et al. .............. | 361/816 |
| 2003/0107881 | A1 | * | 6/2003 | Muramatsu et al. ........ | 361/818 |
| 2004/0165369 | A1 | * | 8/2004 | Lionetta et al. ............. | 361/818 |
| 2005/0287870 | A1 | * | 12/2005 | Kuo ........................... | 439/630 |
| 2006/0109639 | A1 | * | 5/2006 | Nakano ....................... | 361/818 |

* cited by examiner

Primary Examiner—Dean A. Reichard
Assistant Examiner—Xiaoliang Chen
(74) Attorney, Agent, or Firm—Bacon & Thomas, PLLC

(57) ABSTRACT

A handheld communication apparatus includes a metallic insert molding member, a circuit board and a shielding frame. The metallic insert molding member includes a metal plate. An electronic component is mounted on the circuit board. The shielding frame defines opposite first and second openings, wherein the shielding frame is bonded to the metal plate of the metallic insert molding member at the first opening, thereby forming a shielding case. The electronic component on the circuit board is inserted into the second opening of the shielding frame to be shielded by the shielding case.

10 Claims, 6 Drawing Sheets

SHIELDING CASE STRUCTURE OF HANDHELD COMMUNICATION APPARATUS

FIELD OF THE INVENTION

The present invention relates to a shielding case structure, and more particularly to a shielding case structure of a handheld communication apparatus.

BACKGROUND OF THE INVENTION

With increasing development of communication technologies, handheld communication apparatuses such as mobile phones become essential communication products because they are portable and convenient. Recently, a variety of new mobile phones are brought forth and the old ones are weeded out soon. For increasing competitiveness of these mobile phones, the general trends in designing information electronic devices are toward small size, light weightiness and easy portability. Generally, either slim-type injection molding of plastic material or minimization of the electronic components are redered for facilitating fabrication of slim mobile phones.

As known, electrostatic discharge and electromagnetic interference (EMI) are detrimental to the electronic components on the circuit board inside the communication products. For a purpose of minimizing the influence of electrostatic discharge and/or electromagnetic interference (EMI), some important electronic components should be shielded by electrically conductive material, which is referred hereinafter as EMI shielding case.

Conventionally, the EMI shielding case is welded to a ground wire on a printed circuit board (PCB) of the handheld communication apparatus according to the surface mount technology (SMT). Before the EMI shielding case is welded to the ground wire, solder paste has been previously coated onto the circuit board and a steel plate should have been washed. As a consequence, the process of assembling the EMI shielding case is complicated and labor-intensive. Moreover, for maintaining the electronic components which are shielded by the EMI shielding case, the whole EMI shielding case should be detached for inspecting or replacing the shielded electronic components. In addition, the height of the EMI shielding case with respect to the surface of the circuit board is not small enough.

Generally, the conventional EMI shielding cases are classified into two types, i.e. a one-piece structure and a two-piece structure, which are illustrated as follows with reference to FIGS. 1 and 2.

Please refer to FIG. 1, which is a schematic cross-sectional view illustrating a one-piece structure of an EMI shielding case. In FIG. 1, the EMI shielding case 11 is directly welded to a ground wire 121 of a printed circuit board 12 according to the surface mount technology (SMT), thereby shielding the electronic components 13. For neat drawings, however, only one electronic component is shown in the drawing. As previously described, since the EMI shielding case should be detached from the printed circuit board 12 for inspecting or replacing the shielded electronic components, it is time-consuming and labor-intensive to maintain the electronic components shielded by the one-piece EMI shielding case 11. In a case that this EMI shielding case 11 is detached from the printed circuit board 12, it fails to be repeatedly used because it is likely distorted. In addition, during the EMI shielding case 11 is detached from the printed circuit board 12, the electronic components next to the EMI shielding case 11 are possibly collided with the EMI shielding case 11.

Please refer to FIG. 2, which is a schematic cross-sectional view illustrating a two-piece structure. In FIG. 2, the two-piece structure comprises a shielding frame 21 and an EMI shielding case 22. Firstly, the shielding frame 21 is welded to a ground wire 231 of a printed circuit board 23 to enclose the electronic components 24 according to the surface mount technology (SMT). For neat drawings, however, only one electronic component is shown in the drawing. Subsequently, the EMI shielding case 22 is secured to the shielding frame 21 and thus the electronic component 24 is shielded by the EMI shielding case 22. In comparison with the one-piece structure, the two-piece structure is advantageous for maintenance because the EMI shielding case 22 can be separately detached from the shielding frame 21. Unfortunately, this EMI shielding case 22 is still likely distorted and thus fails to be repeatedly used.

In addition to the conventional one-piece structure and two-piece structure, a new approach for assembling the EMI shielding case is illustrated with reference to FIG. 3. The EMI shielding case 31 is referred as a contact-type EMI shielding case and comprises a shielding case main body 311, a metallic frame 312 and an elastic sheet 313. The metallic frame 312 and the elastic sheet 313 are substantially a one-piece structure by punching a metallic part. Firstly, the elastic sheet 313 is placed on a ground wire 321 of a printed circuit board 32 to enclose the electronic components 33. For neat drawings, however, only one electronic component is shown in the drawing. Then, the shielding case main body 311 and the metallic frame 312 are secured to the printed circuit board 32 by for example screwing or other fastening means. Due to the restoring force generated from the compressed elastic sheet 313, a firm attachment between the EMI shielding case 31 and the printed circuit board 32 is rendered. Moreover, the electronic components 33 can be mounted on several regions of the printed circuit board 32, which are partitioned by the metallic frame 312. Since the electronic components shielded by different regions are not interfered with each other, the overall EMI shielding effect is enhanced.

This approach is also advantageous when the maintenance of the shielded electronic components is required. Under this circumstance, the shielding case main body 311 is directly detached from the printed circuit board 32 by loosening the screws. Although the new approach for assembling the EMI shielding case is very convenient, there are still some disadvantages. For example, the width of the ground wire 321 should be at least 1.0 mm, which is much larger than that required for the one-piece structure or two-piece structure (e.g. 0.5 mm). That is to say, this approach for assembling the EMI shielding case will occupy much area of the printed circuit board 32.

In views of the above-described disadvantages resulted from the conventional method, the applicant keeps on carving unflaggingly to develop a shielding case structure of a handheld communication apparatus according to the present invention through wholehearted experience and research.

SUMMARY OF THE INVENTION

It is an object of the present invention to provide a shielding case structure of a handheld communication apparatus for minimizing the influence of electrostatic discharge and/or electromagnetic interference (EMI), in which the shielding case has reduced height and is advantageous for maintenance.

In accordance with an aspect of the present invention, there is provided a handheld communication apparatus. The handheld communication apparatus comprises a metallic insert molding member, a circuit board and a shielding frame. The metallic insert molding member includes a metal plate. An electronic component is mounted on the circuit board. The shielding frame defines opposite first and second openings, wherein the shielding frame is bonded to the metal plate of the metallic insert molding member at the first opening, thereby forming a shielding case. The electronic component on the circuit board is inserted into the second opening of the shielding frame to be shielded by the shielding case.

In an embodiment, the electronic component is a high frequency generating IC module.

Preferably, the shielding frame is made of metallic material.

Preferably, the handheld communication apparatus is a mobile phone.

Preferably, the handheld communication apparatus is a personal digital assistant.

In an embodiment, the electronic component is mounted on the circuit board via a surface mount technology.

In an embodiment, the shielding frame has a higher level than the electronic component with respect to the circuit board.

In an embodiment, the shielding frame is bonded to the metal plate of the metallic insert molding member by an arc welding process or a laser spot welding process.

In an embodiment, the circuit board further comprises a ground wire thereon.

In an embodiment, the shielding frame further comprises a plurality of elastic sheets in the vicinity of the second opening of the shielding frame to be in contact with the ground wire.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Exemplary handheld communication apparatuses of the present invention include but are not limited to mobile phones or personal digital assistants (PDAs).

Figure 1:
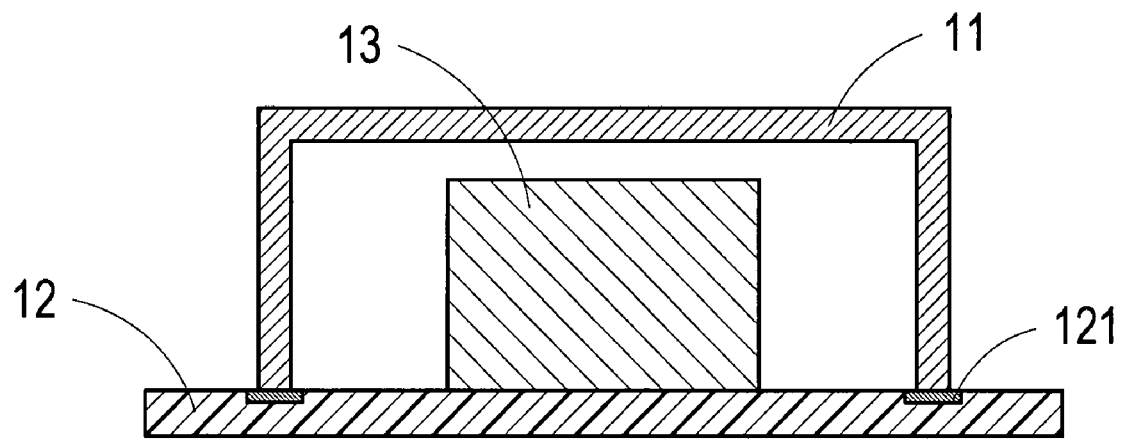
FIG. 1 is a schematic cross-sectional view illustrating a one-piece structure of an EMI shielding case.
Figure 2:
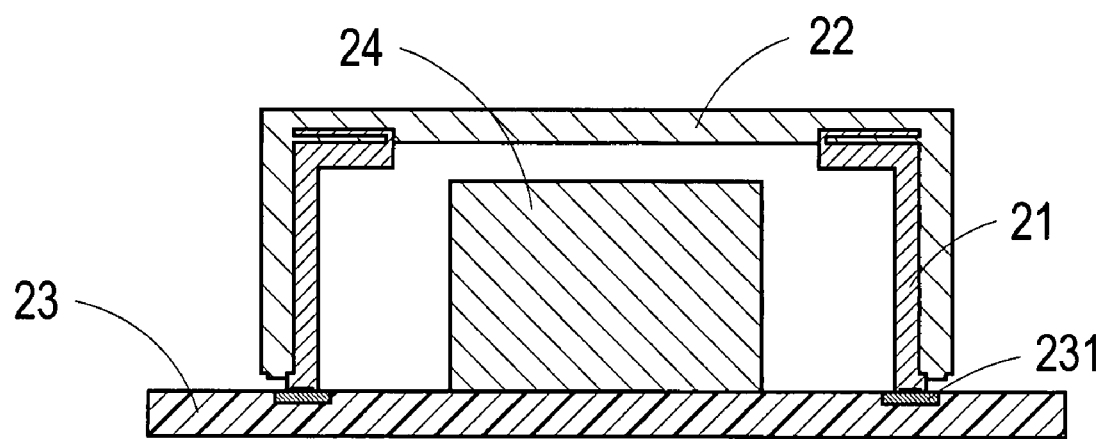
FIG. 2 is a schematic cross-sectional view illustrating a two-piece structure of an EMI shielding case.
Figure 3:
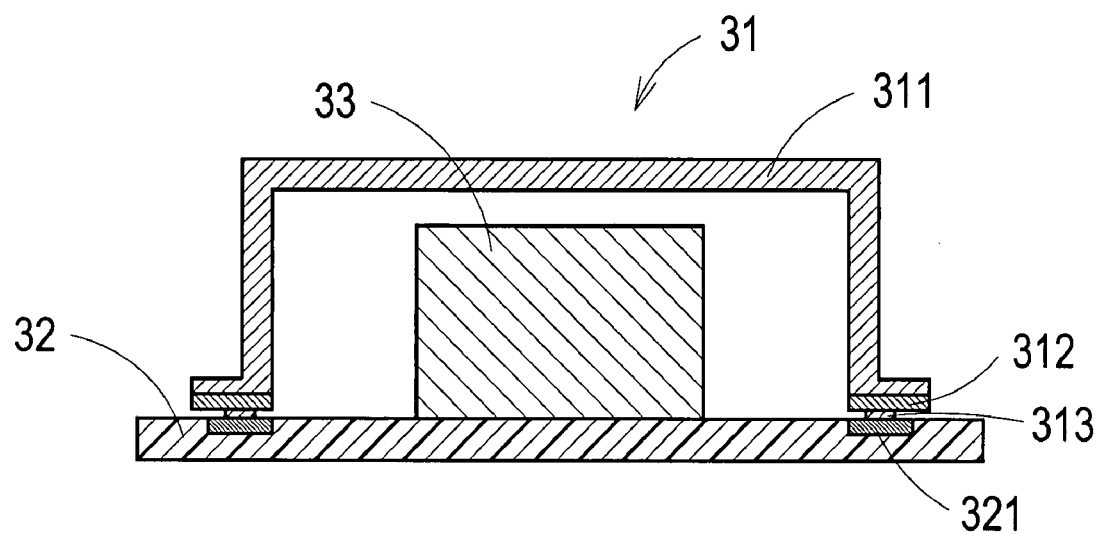
FIG. 3 is a schematic cross-sectional view illustrating contact-type EMI shielding case.
Figure 4A:
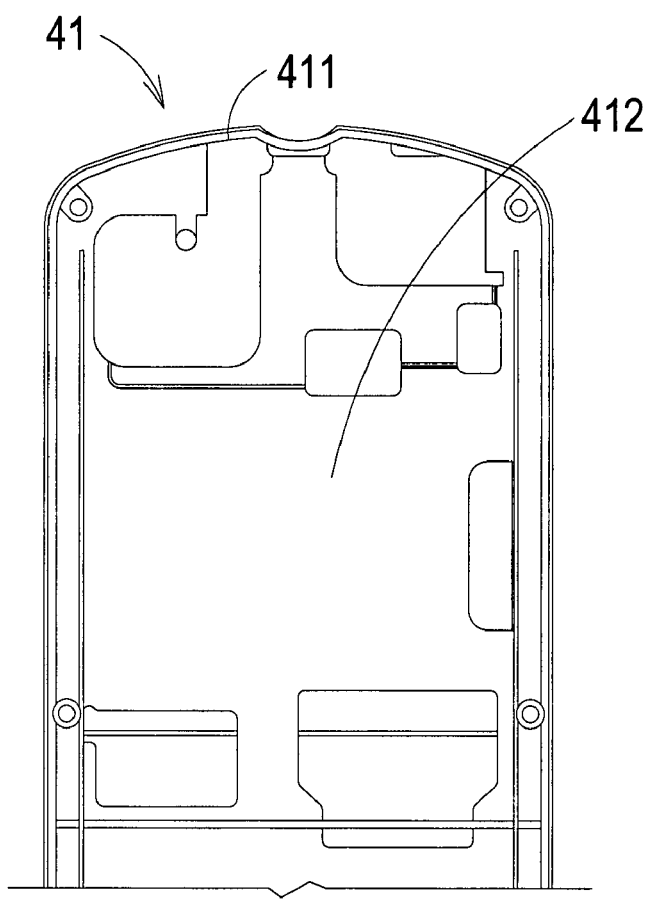
FIG. 4(a) is a schematic top view illustrating the reverse side of a metallic insert molding member used in a handheld communication apparatus according to a preferred embodiment of the present invention.
Figure 4B:
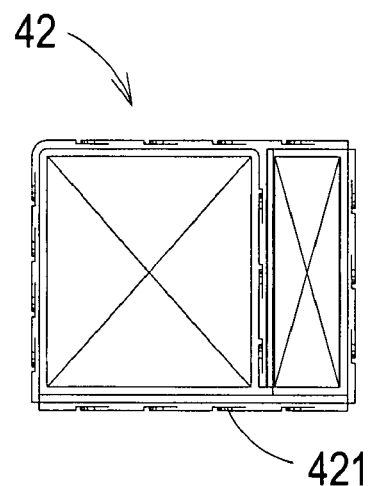
FIG. 4(b) is a schematic top view illustrating a shielding frame used in the handheld communication apparatus of the present invention from the second opening of the shielding frame.
Figure 4C:
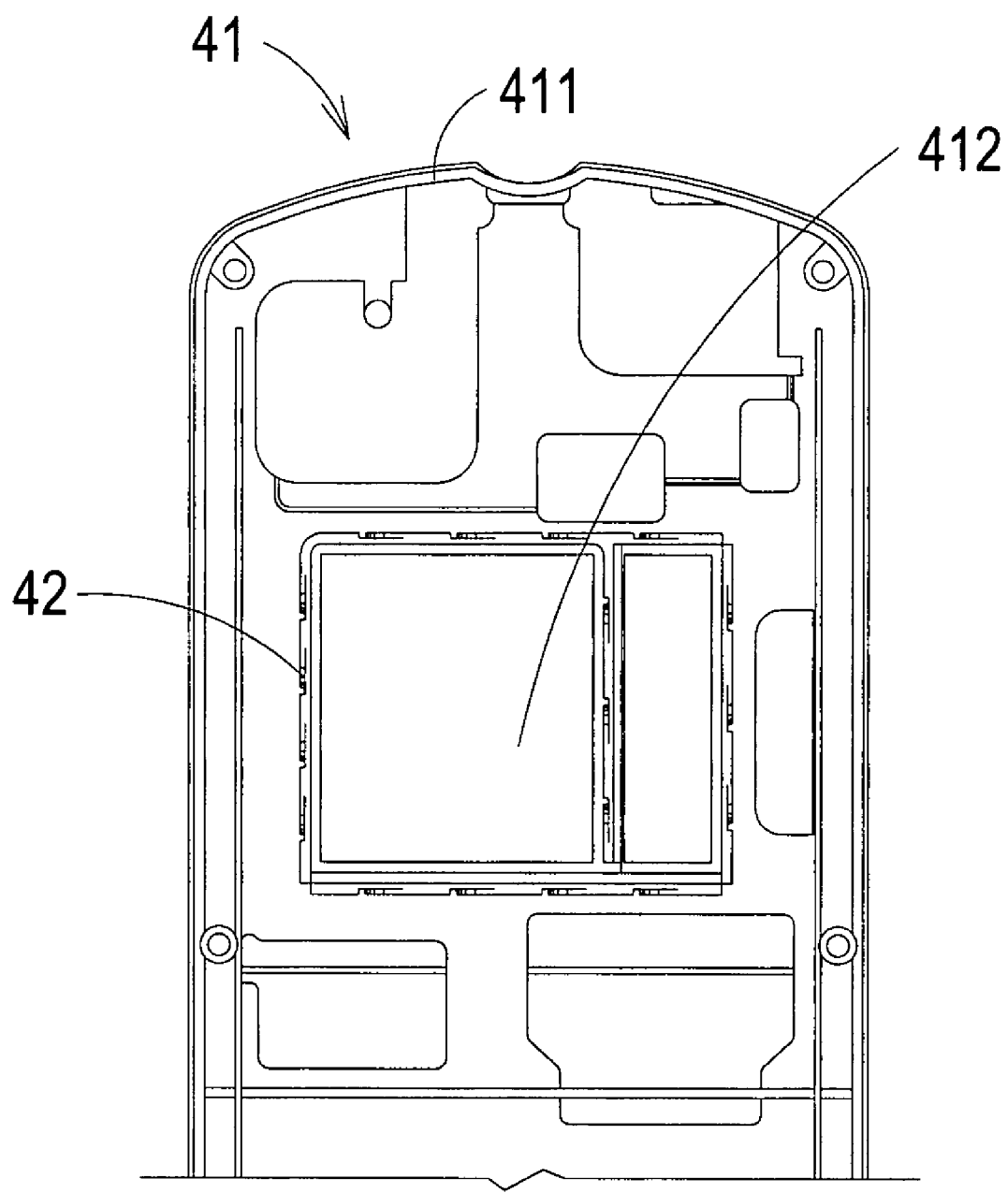
FIG. 4(c) is a schematic top view of the assembly of the metallic insert molding member of FIG. 4(a) and the shielding frame of FIG. 4(b)
Figure 5:
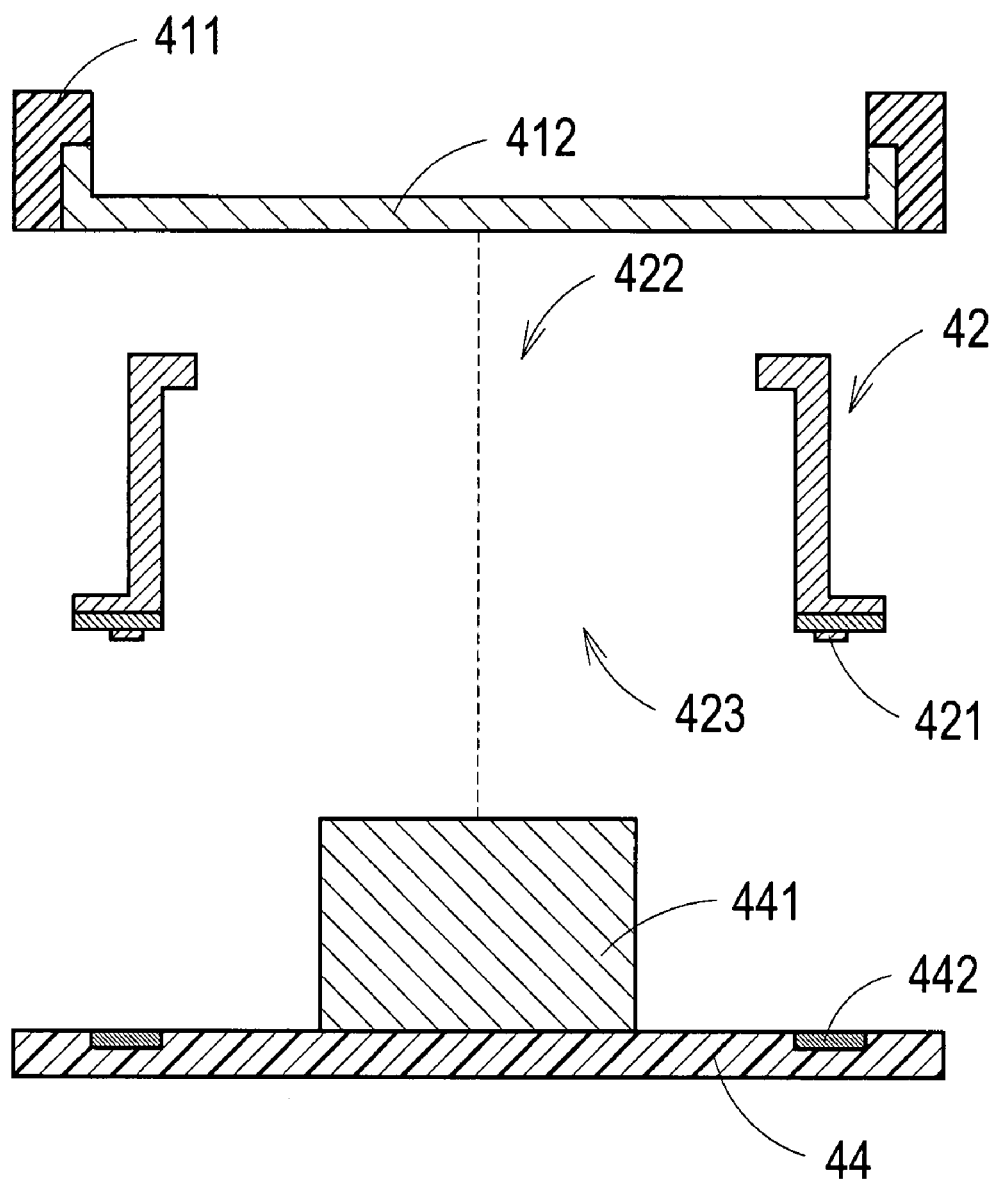
FIG. 5 is a schematic exploded view of a handheld communication apparatus according to a preferred embodiment of the present invention.

Please refer to FIGS. 4(a), 4(b), 4(c) and 5. FIG. 4(a) is a schematic top view illustrating the reverse side of a metallic insert molding member used in a handheld communication apparatus according to a preferred embodiment of the present invention. FIG. 4(b) is a schematic top view illustrating a shielding frame used in the handheld communication apparatus of the present invention from the second opening of the shielding frame. FIG. 4(c) is a schematic top view of the assembly of the metallic insert molding member of FIG. 4(a) and the shielding frame of FIG. 4(b). FIG. 5 is a schematic exploded view of a handheld communication apparatus according to a preferred embodiment of the present invention.

Please refer to FIGS. 4(a) and 5. The metallic insert molding member 41 is produced by a metallic insert molding operation. The metallic insert molding member 41 includes a plastic frame 411 and a metal plate 412. The periphery of the metal plate 412 is embedded into the plastic frame 411.

Figures 6A, 6B:
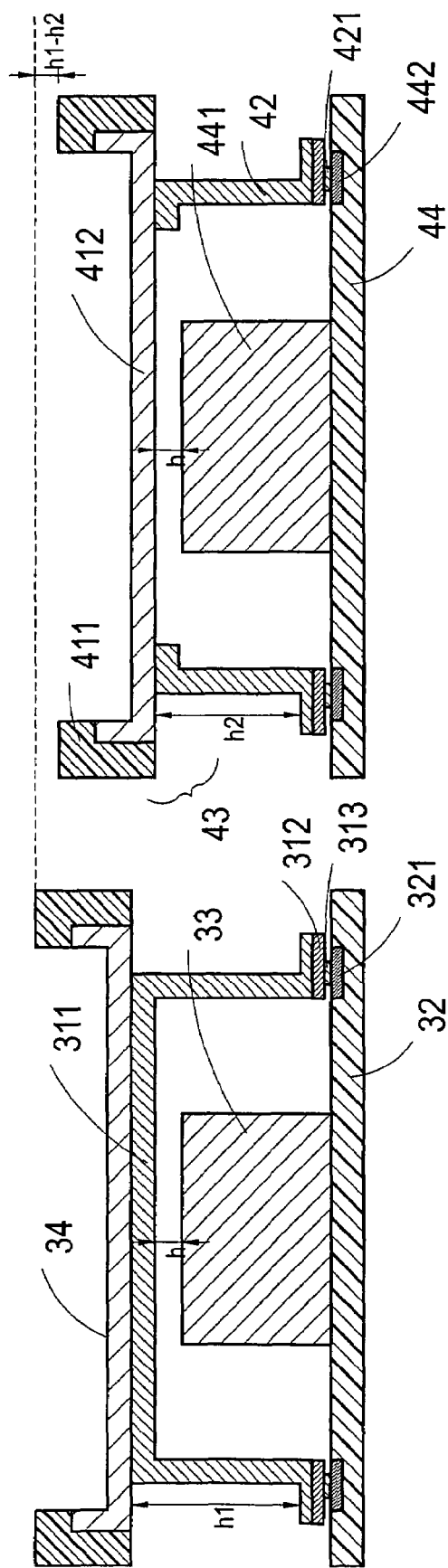
FIG. 6(a) is a schematic cross-sectional view illustrating the packaging structure of the conventional handheld communication apparatus having the contact-type EMI shielding case.
FIG. 6(b) is a schematic cross-sectional view illustrating the packaging structure of the handheld communication apparatus of the present invention.

Please refer to FIGS. 4(b) and 5. The shielding frame 42 is used for enclosing the important electronic components of the handheld communication apparatus to reduce the influence of electrostatic discharge and/or electromagnetic interference (EMI) on the important electronic components of the printed circuit board 44. The shielding frame 42 is made of metallic material, and comprises a plurality of elastic sheets 421, a first opening 422 and a second opening 423. At the first opening 422, the shielding frame 42 is bonded to the metal plate 412 of the metallic insert molding member 41 by an arc welding process or a laser spot welding process. Please also refer to FIGS. 4(c) and 6(b). The metal plate 412 and the shielding frame 42 are bonded together to form a shielding case 43. Whereas, in the vicinity of the second opening 423, the elastic sheets 421 of the shielding frame 42 are bonded to the ground wire 442 of the printed circuit board 44. Due to the restoring force generated from the compressed elastic sheets 421, a firm attachment between the shielding frame 42 and the printed circuit board 44 is rendered.

Nowadays, since the communication apparatuses are developed toward miniaturization and modulization, many functions are integrated into a single IC module. In the above embodiments, the important electronic components to be shielded by the shielding case 43 and mounted on the printed circuit board 44 are for example IC modules 441, as is shown in FIG. 5. For neat drawings, however, only an IC module is shown in the drawing and the other electronic components are omitted. An example of the IC module 441 is a high frequency generating IC module such as a baseband processor IC module, a power amplifier IC module, a transceiver IC module, a power management controller IC module or a memory IC module.

The process for assembling the handheld communication apparatus will be illustrated as follows in more details. Firstly, a printed circuit board 44 having an IC module 441 mounted thereon is provided, and the metal plate 412 and the shielding frame 42 are bonded together to form a shielding case 43. Then, the IC module 441 is inserted into the second opening 443 of the shielding frame 42 to be shielded by the shielding case 43, and the elastic sheets 421 of the shielding frame 42 are bonded to the ground wire 442 of the printed circuit board 44. Afterward, the shielding case 43 is secured to the printed circuit board 44 by for example screwing or other fastening means. Due to the restoring force generated from the compressed elastic sheet 421, a firm attachment between the shielding case 43 and the printed circuit board 44 is rendered. In such manner, since the IC module 441 is fully shielded by the shielding case 43, the influence of electromagnetic interference (EMI) is minimized.

Please refer to FIGS. 6(*a*) and 6(*b*), which are schematic cross-sectional views illustrating the packaging structures of the conventional handheld communication apparatus (having the contact-type EMI shielding case) and the handheld communication apparatus of the present invention, respectively. In the conventional handheld communication apparatus of FIG. 6(*a*), the shielding cover 311 is also bonded onto a metallic insert molding member 34. The distance between the electronic component 33 and the shielding cover 311 is h, and the height of the shielding cover 311 with respect to the circuit board 32 is h1. Likewise, in the present handheld communication apparatus of FIG. 6(*b*), the distance between the electronic component 441 and the metal plate 412 of the metallic insert molding member 41 is also h. Under this circumstance, the height of the metal plate 412 with respect to the circuit board 44 is h2. In comparison with the shielding cover 311, the height of the shielding case 43 is reduced by (h1–h2), for example in the range of from 0.15 to 0.20 mm. That is, the thickness of the handheld communication apparatus of the present invention is reduced.

The improved shielding case structure provided by the present invention, when comparing with other previous conventional technologies, has following advantages:

1. The handheld communication apparatus of the present invention has reduced thickness, as is described in FIGS. 6(*a*) and 6(*b*).

2. Since the shielding case 43 is secured to the printed circuit board 44 by for example screwing or other fastening means without the need of using the surface mount technology, the assembling process of the present invention is simplified and labor-saving when compared with the conventional two-piece structure.

3. Like the conventional contact-type EMI shielding case, the shielding case 43 can be directly detached from the printed circuit board 44 by loosening the screws and thus the present invention is advantageous for inspecting or replacing the shielded electronic components.

4. Since the shielding case 43 is secured to the printed circuit board 44 by for example screwing or other fastening means without the need of using the surface mount technology, the costs associated with the surface mount technology are eliminated.

From the above description, by securing the shielding case 43 to the printed circuit board, the importance electronic components are shielded by the shielding case. In addition, since the height of the shielding case with respect to the circuit board is lowered, the thickness of the handheld communication apparatus of the present invention is reduced to meet the requirement of miniaturization. Moreover, the shielding case can be directly detached from the printed circuit board by loosening the screws and thus the present invention is advantageous for inspecting or replacing the shielded electronic components.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A handheld communication apparatus comprising:
   a metallic insert molding member including a metal plate;
   a circuit board having an electronic component thereon; and
   a shielding frame defining opposite first and second openings, wherein said shielding frame is bonded to said metal plate of said metallic insert molding member at said first opening, and said first opening is covered by said metal plate for forming a shielding case;
   wherein said electronic component on said circuit board is inserted into said second opening of said shielding frame to be shielded by said shielding case.

2. The handheld communication apparatus according to claim 1 wherein said electronic component is a high frequency generating IC module.

3. The handheld communication apparatus according to claim 1 wherein said shielding frame is made of metallic material.

4. The handheld communication apparatus according to claim 1 wherein said handheld communication apparatus is a mobile phone.

5. The handheld communication apparatus according to claim 1 wherein said handheld communication apparatus is a personal digital assistant.

6. The handheld communication apparatus according to claim 1 wherein said electronic component is mounted on said circuit board via a surface mount technology.

7. The handheld communication apparatus according to claim 1 wherein said shielding frame has a higher level than said electronic component with respect to said circuit board.

8. The handheld communication apparatus according to claim 1 wherein said shielding frame is bonded to said metal plate of said metallic insert molding member by an arc welding process or a laser spot welding process.

9. The handheld communication apparatus according to claim 1 wherein said circuit board further comprises a ground wire thereon.

10. The handheld communication apparatus according to claim 9 wherein said shielding frame further comprises a plurality of elastic sheets in the vicinity of said second opening of said shielding frame to be in contact with said ground wire.

* * * * *